United States Patent [19]

Moses, Jr.

[11] Patent Number: 5,296,697

[45] Date of Patent: Mar. 22, 1994

[54] DETECTION CIRCUIT FOR MAINTAINING CONSTANT SIGNAL TRANSFER CHARACTERISTICS OF A LIGHT-SENSITIVE DETECTOR

[75] Inventor: Charlie D. Moses, Jr., Jacksonville, Fla.

[73] Assignee: ParkerVision, Inc., Jacksonville, Fla.

[21] Appl. No.: 926,403

[22] Filed: Aug. 10, 1992

[51] Int. Cl.$^5$ .............................................. H01J 40/14
[52] U.S. Cl. .............................. 250/214 R; 250/214 B; 250/214 A
[58] Field of Search ........... 250/214 R, 214 A, 214 B, 250/214 AG, 214 AL, 214 RC, 338.4, 551; 359/189; 307/311

[56] References Cited

U.S. PATENT DOCUMENTS

| | | | |
|---|---|---|---|
| 3,576,452 | 4/1971 | Smith | 307/311 |
| 3,770,968 | 11/1973 | Hession et al. | 250/214 A |
| 4,355,237 | 10/1982 | Harris, Jr. | 250/551 |
| 4,805,236 | 2/1989 | Urala | 250/214 A |
| 4,808,810 | 2/1989 | Van Doorn | 250/214 A |
| 4,935,618 | 6/1990 | Naito | 250/214 R |
| 4,947,032 | 8/1990 | Janssens | 250/214 B |
| 5,013,904 | 5/1991 | Muro | 250/214 R |
| 5,111,324 | 5/1992 | Jahromi | 250/214 A |
| 5,142,401 | 8/1992 | Shen et al. | 250/214 A |
| 5,166,819 | 11/1992 | Eschel | 250/214 A |

*Primary Examiner*—Michael Messinger
*Attorney, Agent, or Firm*—Arthur G. Yeager

[57] ABSTRACT

A variable impedence photodiode detector circuit for use in detecting signals in the infrared (IR) includes circuitry to maintain a constant reverse bias voltage on the photodetector to maintain the best signal transfer characteristics regarding frequency response, analog bandwidth, sensitivity, output current range, and signal-to-noise ratio over an operating range from total darkness to maximum daylight. A series current source varies the current to the photodiode in response to variations in detector impedance.

21 Claims, 2 Drawing Sheets

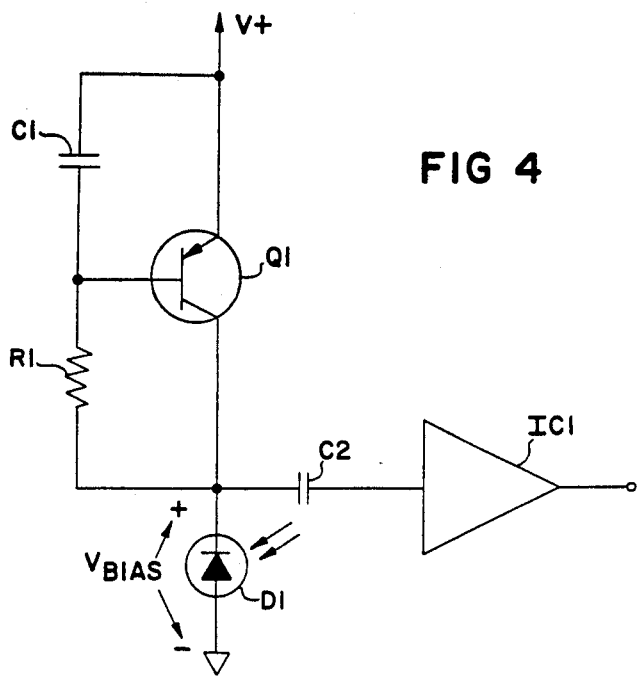
FIG 4
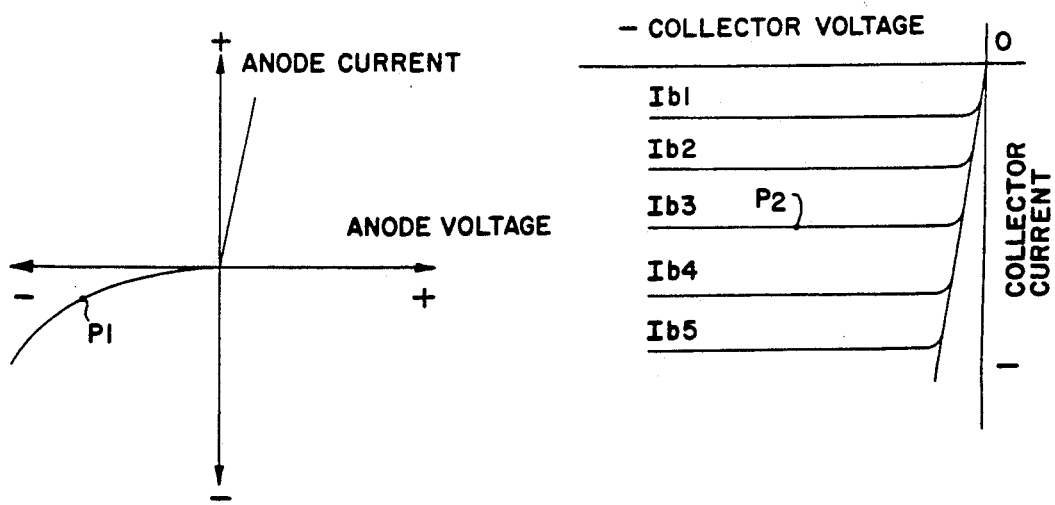
FIG 5
FIG 6

DETECTION CIRCUIT FOR MAINTAINING CONSTANT SIGNAL TRANSFER CHARACTERISTICS OF A LIGHT-SENSITIVE DETECTOR

BACKGROUND OF THE INVENTION

Prior Art

Devices such as photodiodes used to detect and receive electromagnetic signals are well known and widely used. Generally speaking, the photodiode is used in an environment which highly restricts the variations in background or environmental lighting conditions that exist. For example, IR detectors used in TV set remote control receivers are usually recessed in cavities and those used in fiber-optic communications may be totally enclosed.

In the most basic receiver circuit, the resistance of a reverse-biased photodiode changes with incident light resulting in a change of the current in the circuit and the voltage that is developed across a resistor. The result of changing voltage across the resistor is, of course, a change in the bias voltage across the diode with a resultant change in the junction capacitance and a change in the frequency response of the diode. The value of resistance is chosen to provide the best signal-to-noise (S/N) ratio for a given diode. For a highly restricted range of light inputs, the total variation in junction capacitance may not be sufficient to prevent near optimum values for frequency response, S/N, and sensitivity over that light level range. Alternative circuits can be used for the purpose of holding the reverse bias constant via op amps or similar circuits.

In applications where the environmental incident light level may vary from total darkness to unshielded daylight, the problems discussed above become more severe. First, the current range through the diode may extend to the limits of device operation. Second, maintaining a constant bias voltage becomes more difficult over the wider current range. Third, the tradeoffs regarding current and current noise and the effects of resistor size on the S/N ratio become more serious when using the diode over a very wide range.

The desired circuit should have a high output impedence for the photodiode in order to provide maximum sensitivity. A constant bias voltage over the operating range is also needed to provide a constant frequency response. Finally, the photodiode must be able to operate over the widest possible current range without degrading frequency response or sensitivity and without requiring output voltage swings that are difficult to accomplish in practice. None of the prior art circuits are suitable for operation from direct sunlight to total darkness.

SUMMARY OF THE INVENTION

The principal aspect of the present invention includes a method of and circuitry for electrically controlling the sensitivity, frequency response, analog bandwidth and signal to noise ratio of a variable impedance light signal detector circuit that includes a photodiode light detector having junction capacitance and having an impedance that varies in value in response to the intensity of the incident light signal thereon which includes, establishing a reverse bias voltage across the photodetector at a value sufficient in magnitude to reduce the junction capacitance of the photodiode detector to a predetermined minimum value; maintaining the voltage established substantially constant independent of the variance of the impedences of the photodiode detector; limiting by the circuit the current to the diode to below a maximum value independent of the variance of the impedance of the photodiode; and varying the electric current supplied to the photodiode detector in response to the variation of impedance of the photodiode independently of the maintenance of constant voltage.

Other aspects of the present invention include the use of a PNP transistor in electrical series with the detector to act as a current source for the detector.

BRIEF DESCRIPTION OF THE DRAWINGS

The novel features which are believed to be characteristic of this invention are set forth with particularity in the appended claims. The invention itself, however, both as to its organization and method of operation, together with further objects and advantages thereof, may best be understood by reference to the following description taken in connection with the accompanying drawings, in which:

FIG. 4 illustrates the photodiode detector circuit in accord with the present invention;

FIG. 5 is an operating curve for a diode; and

FIG. 6 is a partial operating curve for a PNP transistor.

DETAILED DESCRIPTION OF THE PREFERRED EMBODIMENT

Figure 1:
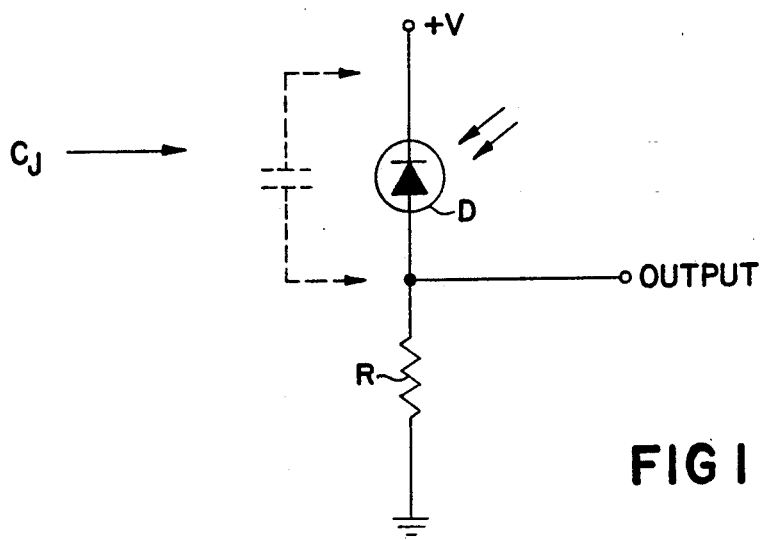
FIGS. 1-3 illustrate photodiode circuits in accord with the prior art.
Figure 2:
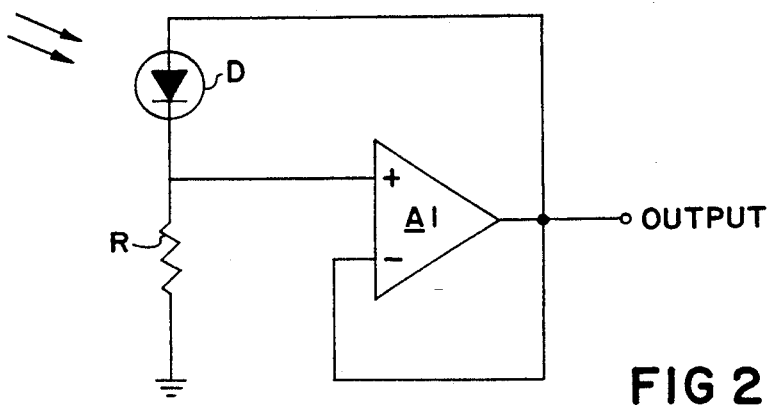
Figure 3:
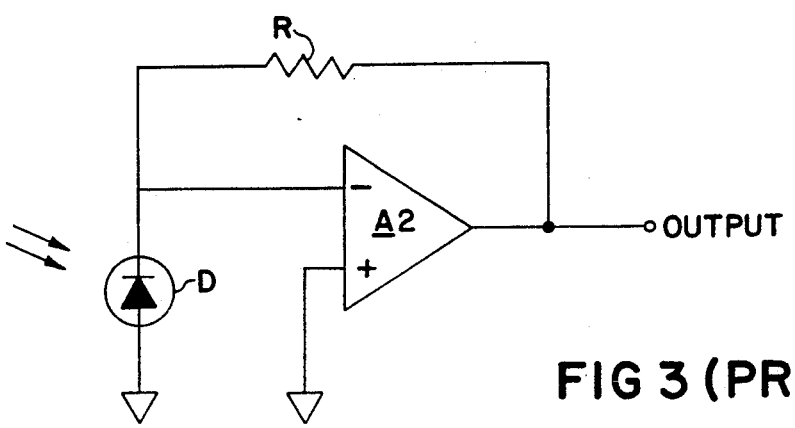

FIGS. 1-3 illustrate prior art circuits that deal with the issues involved in very restricted environments. FIG. 1 illustrates the most basic receiver circuit. The resistance of reverse-biased photodiode D changes with incident light resulting in a change of the current in the circuit and the voltage that is developed across R is, of course, a change in the bias voltage across the diode D with a resultant change in the junction capacitance $C_J$. This change in $C_J$ will result in a change in the frequency response of the diode D by changing the RC time constant of the circuit. The value of R is chosen to provide the best signal-to-noise (S/N) ratio for a given diode D. (Diode noise increases with increasing current). For a highly restricted range of light inputs the diode D will operate only on a small portion of its operating curve (FIG. 5) around, for example, P1, and the total variation in $C_J$ will not be sufficient to prevent near optimum values of signal transfer such as frequency response, S/N ratio, and sensitivity over that light level range.

FIGS. 2 and 3 illustrate "bootstrap" and "transimpedence" circuits respectively for the purpose of holding the reverse bias constant at a zero bias level via the op amps A1 and A2. An additional advantage here is that by using voltage amplification down the line, the value of R can be decreased to increase the frequency response by reducing the RC time constant. This will result in an increase in the resistor's current and thus its contribution to noise but with only limited degradation of the S/N ratio. However, op amps A1 and A2 can maintain only a zero bias on the diode with the result that $C_J$ is at a maximum value thus providing the worst frequency response and smallest bandwidth. Lowering R to reduce the RC time constant will only increase noise.

With regard now to FIGS. 4-6, the IR sensor circuitry in accord with the present invention is depicted generally at numeral 10 in FIG. 4. Photodiode D1 is a photoconductive semiconductor device and is reverse biased to provide an output coupled via capacitor C2 to output amplifier IC1 which may be circuitry of any appropriate configuration desired in the circumstances.

Q1 is a PNP transistor connected in a common base configuration with the collector output impedance in parallel with resistor R1. R1 is selected on the basis of maximum diode current and the appropriate reverse bias voltage ($V_{bias}$) across the diode. C1 is selected based upon the frequency response characteristics of Q1 to preserve the AC component of the incoming IR signal and will also prevent the circuit from acting as an amplifier. With reference to FIG. 6, it can be seen that with power applied to the circuit, a given base current, $I_{b1}$–$I_{b5}$, will be provided for a given collector voltage and a chosen value of R1, usually 50k–100k ohms to match the DC resistance of D1, to provide an operating point at P2 for Q1 at an acceptable S/N ratio.

As varying levels of light intensity are received by the diode D1, the resistance of D1 will increase or decrease with, for example, an increase in light resulting in a respective decrease in D1 resistance. Base current, however, will remain constant providing a constant reverse bias voltage ($V_{bias}$) across D1 via R1. Collector current, however, will either decrease or increase. As diode resistance decreases the collector current from Q1 will increase. $V_{bias}$, however, remains constant providing for constant frequency response and constant diode sensitivity over the entire range of operation. Constant circuit sensitivity results from the constant value of impedance in the D1 current path that is derived from the parallel combination of the very high value of collector impedance and R1. The circuit sensitivity also is designed to be maximum by selecting the proper value for R1 to match the input impedance of D1. The frequency response is constant because of constant $V_{bias}$. The output current range can be as wide as desired and can easily vary by orders of magnitude as appropriate in the circumstances with a maximum value established to provide for a desired signal to noise ratio.

It is important to keep in mind the very large operating range that the present invention is designed to accommodate. Typically, the current operating range of a photodiode such as D1 varies by 200:1 or more from a total "dark current" of 10 ua to a direct sunlight current of 2 ma. With a value of R1 of around 50-100k ohms, the voltage across the diode can vary the same amount: from 0.5 volt-100 volts. In the present invention, however, the voltage across R1 is held constant as the current through D1 increases to the full light input value. And, unlike the prior art whereby the bias on the photodiode is maintained constant at zero bias, the present invention provides for an optimum non-zero reverse bias on the photodiode D1 in order to achieve the optimum in frequency response while allowing the variance of the diode current through the entire operating range of the device.

The reverse bias ($V_{bias}$) on diode D1 is also set to provide for a predetermined minimum junction capacitance for the device to maximize the frequency response and analog bandwidth of the device and the associated circuit in addition to simply holding the bias constant. Accordingly, the frequency response and analog bandwidth will be both optimum and constant over the entire operating range of the device.

I claim:

1. A method of electrically controlling the signal transfer characteristics of a variable impedance electromagnetic signal detector having an impedance that varies in response to the signal detected over an operating range of input signal intensity comprising the steps of:
   A. establishing a voltage across the detector;
   B. maintaining the voltage established in step A substantially constant independent of the variation of the impedance of the detector over the operating range of the detector; and
   C. varying the electric current supplied to the detector in response to the variation in the impedance of the detector over the operating range of the detector independently of the maintenance of constant voltage in step B.

2. A method of electrically controlling the signal transfer characteristics of a light signal detector circuit that includes a photodiode detector having an impedence that varies in response to the intensity of an incident light signal thereon comprising the steps of:
   A. establishing a bias voltage on the photodiode detector;
   B. maintaining the voltage established in step A substantially constant independent of the variance of the impedance of the photodiode detector in response to variance of the intensity of the incident light detected by the photodiode; and
   C. varying the electric current supplied to the photodiode detector by the detector circuit in response to the variation of the impedance of the photodiode independently of the maintenance of constant voltage in step B.

3. A method of controlling the sensitivity of a light signal detector circuit that includes a photodiode detector having an impedance that varies in response to the intensity of incident light thereon comprising the steps of:
   A. establishing by the circuit of an input impedance at the input to the photodiode detector;
   B. establishing a bias voltage on the photodiode detector;
   C. maintaining the bias voltage established in step B substantially constant and independent of the variance of the impedance of the photodiode detector; and
   D. varying by the circuit the electric current supplied to the photodiode detector in response to variations in the impedance of the photodiode detector independently of the maintenance of constant voltage in step B.

4. The method of claim 3 wherein step A includes the step of:
   E. establishing by the circuit an input impedance that is substantially equal to the impedance of the photodiode detector when no light is being detected by the photodiode detector.

5. The method of claim 4 wherein step D includes the step of:
   F. maintaining by the circuit a substantially constant input impedance to the photodiode detector as the impedance of the photodiode detector varies.

6. A method of establishing and maintaining the frequency response of a variable impedance photodiode detector at a predetermined constant value during operation of the detector to detect incident light over a range of detected incident light intensity from total darkness to maximum light intensity for a photodiode having a junction capacitance that varies in response to the magnitude of reverse voltage placed thereacross comprising the steps of:

A. establishing a reverse bias voltage on the photodiode detector;

B. maintaining the voltage established in step A on the photodiode detector at a substantially constant value independent of the variation of the impedence of the photodiode detector over the operating range of incident light intensity; and C. varying the electric current supplied to the photodiode detector in response to the variation of impedence of the photodiode independently of the maintenance of constant voltage in step B.

7. The method of claim 6 wherein step A includes the step of:

D. establishing the value of reverse bias voltage at a magnitude that will result in a predetermined minimum value of the junction capacitance of the photodiode detector.

8. A method of establishing and maintaining the analog bandwidth of a variable impedence photodiode detector circuit at a maximum constant value for a detector circuit that includes a photodiode detector for the detection of incident light wherein the detector has a junction capacitance that varies in response to the magnitude of reverse voltage placed across the photodiode comprising the steps of:

A. establishing a reverse bias voltage on the photodiode detector;

B. maintaining the voltage established in step A on the photodiode detector at a substantially constant value independent of the variation of the incident light detected; and C. varying the electric current supplied to the photodiode detector in response to the variation of impedence of the photodiode independently of the maintenance of constant voltage in step B.

9. The method of claim 8 wherein step A includes the step of:

D. establishing a magnitude of the reverse bias voltage to provide a predetermined minimum value for the junction capacitance of the photodiode detector.

10. A method of establishing and maintaining the signal to noise ratio of a variable impedence photodiode detector circuit at or above a predetermined value comprising the steps of:

A. establishing by the circuit an input impedance in the current path of the photodiode detector to limit the maximum current through the diode to below a predetermined value to provide a signal to noise ratio at or above the desired value;

B. maintaining the input impedance at a substantially constant value over the range of variable impedence of the photodiode detector; and C. varying the electric current supplied to the photodiode detector in response to the variation of impedance of the photodiode independently of the maintenance of constant voltage in step B.

11. A method of electrically controlling the sensitivity, frequency response, analog bandwidth and signal to noise ratio of a variable impedance light signal detector circuit that includes a photodiode light detector having junction capacitance and having an impedence that varies in value in response to the intensity of the incident light signal thereon comprising the steps of:

A. establishing a reverse bias voltage across the photodetector at a value sufficient in magnitude to reduce the junction capacitance of the photodiode detector to a predetermined minimum value;

B. maintaining the voltage established in step A substantially constant independent of the variance of the impedence of the photodiode detector;

C. limiting by the circuit the current to the diode to below a maximum value independent of the variance of the impedence of the photodiode; and D. varying the electric current supplied to the photodiode detector in response to the variation of impedance of the photodiode independently of the maintenance of constant voltage in step B.

12. An electromagnetic signal detection circuit comprising a photodiode responsive to incident electromagnetic signals having an impedance which varies in response to the intensity of said signals, circuit means connected to said photodiode for providing an output signal in response to variations in said impedance of said photodiode, said circuit means including bias voltage circuit means for providing a current reverse bias voltage across said photodiode independent of the variation of said impedance of said photodiode to maintain the signal transfer characteristics of said photodiode constant over a predetermined range of intensity of incident electromagnetic signals, said bias voltage circuit means including a bias resistor in electrical series with said photodiode for maintaining said bias voltage constant and a current source in electrical series with said photodiode for varying the electric current supplied to said photodiode when said photodiode impedance varies independently of the maintenance of said bias voltage constant.

13. The detection circuit as defined in claim 12 wherein said current source includes a PNP transistor, said photodiode being located in series with the collector of said transistor.

14. The detection circuit as defined in claim 13 wherein said bias resistor is connected between the base and collector of said transistor.

15. The detection circuit as defined in claim 13 wherein said electric circuit means further includes a capacitance connected between the emitter and base of said transistor to inhibit operation of said circuit means as an amplifier.

16. The detection circuit as defined in claim 12 wherein said photodiode has junction capacitance, said bias voltage being established by said bias voltage circuit means to provide for predetermined minimum value for said junction capacitance.

17. The detection circuit as defined in claim 14 wherein said bias resistor has a value substantially equal to the DC resistance of said photodiode.

18. An electromagnetic signal detection circuit comprising a semiconductor photodiode responsive to incident electromagnetic signal having an impedance which varies in response to the intensity of said signals, circuit means connected to said photodiode for providing an output signal in response to variations in said impedance of said photodiode, said circuit means including bias voltage circuit means for providing a constant reverse bias voltage across said photodiode independent of the variation of said impedance of said photodiode to maintain the frequency response of said photodiode constant over a predetermined range of intensity of the incident electromagnetic signals, said bias voltage circuit means including a bias resistor in electrical series with said photodiode for maintaining said bias voltage constant and a current source in electrical series with said photodiode for varying the electric current supplied to said photodiode when said photodiode impedance varies independently of the maintenance of said bias voltage constant.

19. The detection circuit as defined in claim 18 wherein said bias voltage is established by said bias voltage circuit means to provide for a minimum predetermined value of the junction capacitance of said photodiode to provide for a predetermined value of frequency response of said detection circuit.

20. A light signal detection circuit comprising a photodiode responsive to incident light signals having an impedance which varies in response to the intensity of said signals, circuit means connected to said photodiode for providing an output signal in response to variations in said impedence of said photodiode, said circuit means including bias voltage circuit means for providing a constant reverse bias voltage across said photodiode independent of the variation of said impedence of said photodiode to maintain the sensitivity of said photodiode constant at a predetermined value over a predetermined operating range of intensity of the incident light signals, said bias voltage circuit means including a bias resistor in electrical series with said photodiode for maintaining said bias voltage constant and a current source in electrical series with said photodiode for varying the electric current supplied to said photodiode when said photodiode impedance varies independently of the maintenance of said bias voltage constant.

21. An electromagnetic signal detection circuit comprising a semiconductor photoconductive detector responsive to incident electromagnetic signals having an impedance which varies in response to the intensity of said signals, circuit means connected to said detector for providing an output signal in response to variations in said impedence of said detector, said circuit means including bias voltage circuit means for providing a constant reverse bias voltage across said detector independent of the variation of said impedence of said detector to minimize the junction capacitance of said detector over a predetermined operating range of intensity of the incident electromagnetic signals to provide a maximum constant analog bandwidth over said operating range, said bias voltage circuit means including a bias resistor in electrical series with said photodiode for maintaining said bias voltage constant and a current source in electrical series with said photodiode for varying the electric current supplied to said photodiode when said photodiode impedance varies independently of the maintenance of said bias voltage constant.

* * * * *